US006622817B1

(12) United States Patent
Bachmann et al.

(10) Patent No.: US 6,622,817 B1
(45) Date of Patent: Sep. 23, 2003

(54) SOUND REPRODUCTION DEVICE WORKING ACCORDING TO THE BENDING WAVE PRINCIPLE

(75) Inventors: Wolfgang Bachmann, Grevenbroich (DE); Gerhard Krump, Schwarzach (DE); Hans-Jürgen Regl, Regensburg (DE)

(73) Assignee: Harman Audio Electronic Systems GmbH, Straubing (DE)

( * ) Notice: Subject to any disclaimer, the term of this patent is extended or adjusted under 35 U.S.C. 154(b) by 0 days.

(21) Appl. No.: 09/700,301

(22) PCT Filed: May 14, 1999

(86) PCT No.: PCT/EP99/03314

§ 371 (c)(1), (2), (4) Date: Jan. 22, 2001

(87) PCT Pub. No.: WO99/60819

PCT Pub. Date: Nov. 25, 1999

(30) Foreign Application Priority Data

May 15, 1998 (DE) ........................................ 198 21 862

(51) Int. Cl.[7] .................................................. H05K 5/00
(52) U.S. Cl. ........................ 181/150; 181/173; 381/431
(58) Field of Search ................................ 181/173, 174, 181/171, 141, 150, 199; 381/423, 424, 431, 430, 426, 152

(56) References Cited

U.S. PATENT DOCUMENTS 4,242,541 A * 12/1980 Ando ......................... 381/424
4,456,848 A 6/1984 Yasuda et al.

(List continued on next page.)

FOREIGN PATENT DOCUMENTS

| | | |
|---|---|---|
| DE | 39 07 540 | 12/1989 |
| EP | 0 390 123 A2 | 10/1990 |

(List continued on next page.)

OTHER PUBLICATIONS

International Search Report, completed on Oct. 7, 1999 and mailed on Oct. 14, 1999.

(List continued on next page.)

*Primary Examiner*—Khanh Dang
(74) *Attorney, Agent, or Firm*—Foley Hoag LLP

(57) ABSTRACT

The invention concerns the embodiment of panel loudspeakers working according to the bending wave principle. Said loudspeakers are generally formed by at least one acoustic panel (11) and at least one driver (12), the driver (12) being connected to the acoustic panel (11). When such acoustic panels (11) are used for reproducing low frequency audio signals, the acoustic panel (11) must be arranged in sufficiently large sound walls in order to exclude the occurrence of an acoustic short circuit between the front part and the back part of the panel. Apart from being costly, only one side of the sound walls is actively used for sound generation as a result of the separation of both acoustic panels (11). Hence, the invention aims at providing a panel loudspeaker (10) that does not require any additional sound walls in order to exclude the occurrence of an acoustic short circuit while at the same time enabling full utilization of the surface of the acoustic panel (11) for sound generation. This is achieved by arranging two of the acoustic panels (11.1, 11.2) at a distance (A) in relation to each other, by providing elements (13) connecting both acoustic panels (11.1, 11.2) and by arranging the drivers (12) on the sides of the acoustic panels (11.1, 11.2) facing each other. Due to the fact that, once connected, both acoustic panels (11.1, 11.2) vibrate in opposite directions they mimic the principle of a breathing sphere or wall.

23 Claims, 3 Drawing Sheets

U.S. PATENT DOCUMENTS

| | | | | | |
|---|---|---|---|---|---|
| 4,472,605 | A | | 9/1984 | Klein | |
| 4,665,550 | A | | 5/1987 | Haas | |
| 4,969,197 | A | * | 11/1990 | Takaya | 381/152 |
| 6,160,898 | A | | 12/2000 | Bachmann et al. | 381/425 |
| 6,170,603 | B1 | * | 1/2001 | Bachmann et al. | 181/173 |
| 6,192,136 | B1 | * | 2/2001 | Azima et al. | 381/424 |
| 6,275,598 | B1 | | 8/2001 | Bachmann et al. | 381/425 |
| 6,327,369 | B1 | * | 12/2001 | Azima et al. | 381/152 |
| 6,347,149 | B1 | | 2/2002 | Bachmann et al. | 381/396 |
| 6,369,943 | B1 | | 4/2002 | Bachmann et al. | 359/445 |
| 6,494,289 | B1 | | 12/2002 | Bachmann et al. | 181/173 |
| 6,560,348 | B1 | * | 5/2003 | Bachmann et al. | 381/425 |
| 2001/0017927 | A1 | | 8/2001 | Bachmann et al. | 381/395 |
| 2001/0055403 | A1 | | 12/2001 | Bachmann et al. | 381/190 |

FOREIGN PATENT DOCUMENTS

| | | |
|---|---|---|
| EP | 0390 123 B1 | 11/1994 |
| EP | 0 924 959 | 6/1999 |
| WO | WO 97/09859 | 3/1997 |
| WO | WO 97/09861 | 3/1997 |

OTHER PUBLICATIONS

Ser. No. 09/700,139; filed Nov. 9, 2000.
Ser. No. 09/719,279; filed Dec. 8, 2000.
U.S. Application Ser. No. 09/665,894.
U.S. Application Ser. No. 10/130,853.
U.S. Application Ser. No. 10/240,124.

* cited by examiner

SOUND REPRODUCTION DEVICE WORKING ACCORDING TO THE BENDING WAVE PRINCIPLE

FIELD OF THE INVENTION

The invention relates to the formation of sound reproduction devices that operate according to the bending wave principle, and more particularly to devices that better utilize the surfaces provided for sound generation.

BACKGROUND OF THE INVENTION

Sound reproduction devices that operate according to the bending wave principle are known in the art. Such devices are formed essentially of a sound panel and at least one drive system, wherein oscillations are induced in the sound panel when electrical audio frequency signals are supplied to the drive system(s). According to one feature of this type of sound reproduction device, a "bending wave radiation" is enabled above a lower limit frequency, also called critical frequency, wherein the bending waves in the plane of the respective sound panel cause the sound to be radiated in a direction that is frequency-dependent. In other words, a cross-section through a directional diagram shows a main lobe with a frequency-dependent direction. These conditions are valid for panels and absorbing panels with an infinite surface area. However, the conditions applying to multi-resonance panels (also refer to as distributed mode loudspeaker) which are the subject matter of the present application, are significantly more complex due to severe boundary reflexes. The increased complexity of multi-resonance plates is caused by a plurality of additional main lobes which are superimposed on the so-called main lobe which has a frequency-dependent direction, thereby producing a strongly fanned-out directional diagram which also has a strong frequency-dependence. Typically, the directional diagrams of the multi-resonance plates to be described here are on average oriented away from the surface normal. This characteristic has the effect that the space plays a much more important role in the projection of the sound waves.

The sound panel is constructed according to a sandwich principle, in that two opposing surfaces of a very light for layer are connected with a thin cover layer, for example through an adhesive bond. For enhancing the sound reproduction characteristic of the sound panel, the material used for the cover layer should have a particularly high dilatational wave velocity.

Suitable materials for the cover layers are, for example, thin metal foils or fiber-reinforced plastic foils.

The core layer also has to meet certain requirements. The materials used for the core layer should have a small mass density and a small damping. In addition, the materials for the cover layer should have a sufficiently high shear modulus perpendicular to the surfaces to which the cover layers are applied. The materials used for the core layers should also have a small elasticity module in the direction in which the core layer formed from this material has its largest expansion. The two latter requirements which initially appear to be contradictory, are most likely satisfied by a core layer that has a hole structure with openings between the two surfaces to which the cover layers are applied. The openings should preferably have a small cross-section. Instead of core layers with the hole structure, rigid expanded foam can also be used as a material for the core layers, since such foams have a suitable shear and elasticity module in spite of their isotropic material properties. It should also be noted that if the core layer is made of rigid expanded foams, then the anisotropic characteristic of the sound panel should be provided by the cover layers.

The sound panels are driven by drivers which—as described in DE-A-197 57 097—are either attached to or integrated with the respective sound panel.

To reproduce, in particular, low frequency audio signals with the aforedescribed sound panels, specific measures should be taken to reduce acoustic short-circuits. This can be easily realized by providing a sufficiently large sound wall in which the sound panel is installed. However, the sound wall not only increases the cost, but may also reduce the surface area of the sound panel that is potentially available for radiating sound.

It is therefore an object of the invention to provide a sound panel which reduces or eliminates acoustic short-circuits without requiring additional space, and at the same time utilizes the surface area of the sound panel that is a available for radiating the sound, to increase the sound level and/or broaden the frequency range.

SUMMARY OF THE INVENTION

When two sound panels are arranged with a mutual spacing A therebetween and surrounded by a frame, a space is formed between the two sound panels and the frame which separates those sound waves that are radiated in this space from the sound waves that are radiated by the opposing surfaces of the sound panels. If the drivers that drive the sound panels arranged with the mutual spacing A are addressed electrically in parallel, then a monopole radiator is formed, which provides a particularly advantageous acoustic irradiation of the auditorium due to the fact that the sound panels oscillate in opposite directions and hence operate according to the principle of a breathing sphere and/or wall.

The sound panels and/or the frame should include sound exit openings if the sound energy that radiates into the space formed by the sound panels and the frame, is to be available for radiating sound into the auditorium. In this case, the space formed between the sound panels and the frame can form a bass reflex volume and the respective sound exit openings a bass reflex opening. The sound exit opening can also be connected to a transmission line.

It should be mentioned that the device according to the invention is not limited to the reproduction of bass frequencies. For example, a combined device can be built, wherein one sound panel together with the aforedescribed space can be used to predominantly reproduce bass frequencies, whereas the other sound panel can be optimized for reproducing, for example, the midrange/high frequency range. The transmission ranges of the two sound panels can be optimized by suitably selecting their respective materials and/or dimensions, for example by choosing a different thickness and/or the material for the core layer and/or the cover layers, respectively. Moreover, the sound panel that reproduces the bass frequencies, unlike the other sound panels, need not directly face a listener, because of the human ear is generally unable to pinpoint the origin of sound with a frequency below 100 Hz.

The driver driving one sound panel can simultaneously provide a counter support for the driver driving the other sound panel. Such an arrangement is particularly advantageous if the connected drivers that drive the different sound panels are electrically connected so that the current flow is codirectional, causing the different sound panels to oscillate in is opposite directions.

The device can be made less complex if the two connected drivers are formed as common drivers. This should be understood as representing an arrangement wherein common components and magnetic circuits contribute to driving both sound panels that are arranged with the spacing A.

The rigidity of the two sound panels can be increased by supporting the two sound panels with resilient elements, e.g. springs, arranged in the gap A. In addition, the resilient elements have damping attributes and can therefore be used to tune the sound panels.

Advantageously, the drivers can be attached to the elements (frame and/or springs) rather than to the sound panels. With the drivers supported in this way, mass loading does not at all or only slightly interfere with the propagation of the bending waves in the sound panels. The drivers also do not contribute to the damping.

BRIEF DESCRIPTION OF THE DRAWINGS

It is shown in

DETAIL DESCRIPTION OF CERTAIN ILLUSTRATED EMBODIMENTS

The invention will now be described with reference to the Figures.

Figure 1:
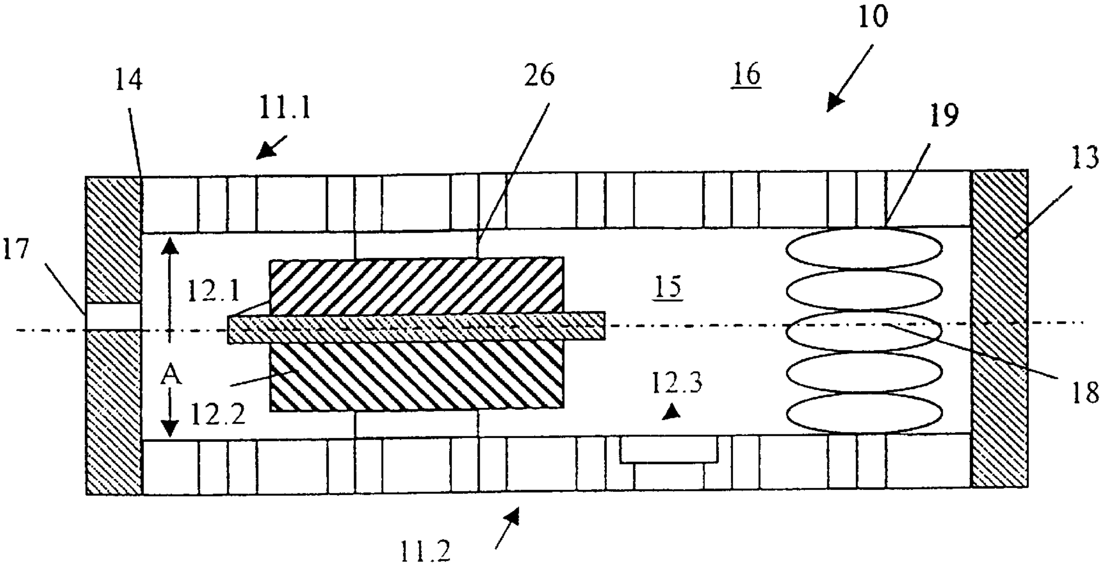
FIG. 1 a cross-sectional side view of a sound reproduction device.

The cross-sectional side view depicted in FIG. 1 shows a sound production device 10 that is essentially formed of a front sound panel 11.1, a rear sound panel 11.2, three drivers 12.1, 12.2, 12.3 and a frame 13.

The two sound panels 11.1, 11.2 are separated by a gap A and connected with their respective marginal edges 14 to the frame 13. The connection between the frame 13 and the sound panels 11.1, 11.2 can be a rigid connection; however, in another embodiment (not shown) a bead can be disposed between the frame 13 and the sound panels 11.1, 11.2. This type of connection is illustrated, for example, in an application filed by the applicant of the present application concurrently with the present application. Two of the three drivers 12 are inserted back-to-back in the space 15 enclosed by the two sound panels 11.1, 11.2 and the frame 13. In this embodiment, the two drivers 12.1, 12.2 which are shown only schematically, are completely identical and implemented as ferrite systems connected with the respective sound panels 11.1, 11.2 through moving coil supports 26. When the moving coils of the two drivers 12.1, 12.2 are electrically connected with an audio signal source (not shown), both sound panels 11.1, 11.2 are deformed in opposite directions. This deformation of the two sound panels 11.1, 11.2 causes the sound reproduction device 10 to function like a breathing sphere and/or wall.

It should also be mentioned to that the sound reproduction device 10 depicted in FIG. 1 is designed as a bass reproduction device. An acoustic short-circuit between the surfaces of the two sound panels 11.1, 11.2 which are coupled directly to the auditorium is averted since the acoustic signals cause the two sound panels 11.1, 11.2 to move in opposite directions relative to the indicated center line, so that the acoustic energy radiated into the space 15 is separated from the auditorium by the sound panels 11.1, 11.2 and the frame 13. To make the acoustic energy radiated into the space 15 available for filling the auditorium 16 with sound, the volume of the space 15 can be used as a so-called bass reflex volume, whereby the inside of the space 15 is connected through at least one sound exit opening 17 with the auditorium 16. In the embodiment depicted in FIG. 1, the sound exit opening 17 is formed in the frame 13; however, in an alternative embodiment (not shown), the sound exit opening 17 can also be located in the sound panel 11.

In addition, a resilient element 18 can be inserted in the space 15 providing additional support at the connection points 19 of the sound panels 11.1, 11.2 that are separated by the gap A. Aside from the support function, the resilient element 18 may also contribute to filtering of the sound waves radiated by the sound panels 11.1, 11.2.

A driver designated by the numeral 12.3 and formed, for example, as a piezo driver can be inserted in the sound panel 11.2. This driver 12.3 can be used to drive the sound panel 11.2 to radiate, for example, high frequency audio signals. Since high frequencies sound waves, unlike low frequency sound waves, have a directional characteristic, the sound panel 11.2 with the driver 12.3 of the sound reproduction device 10 should more or less face of the listener in the auditorium 16 directly.

Figure 2:
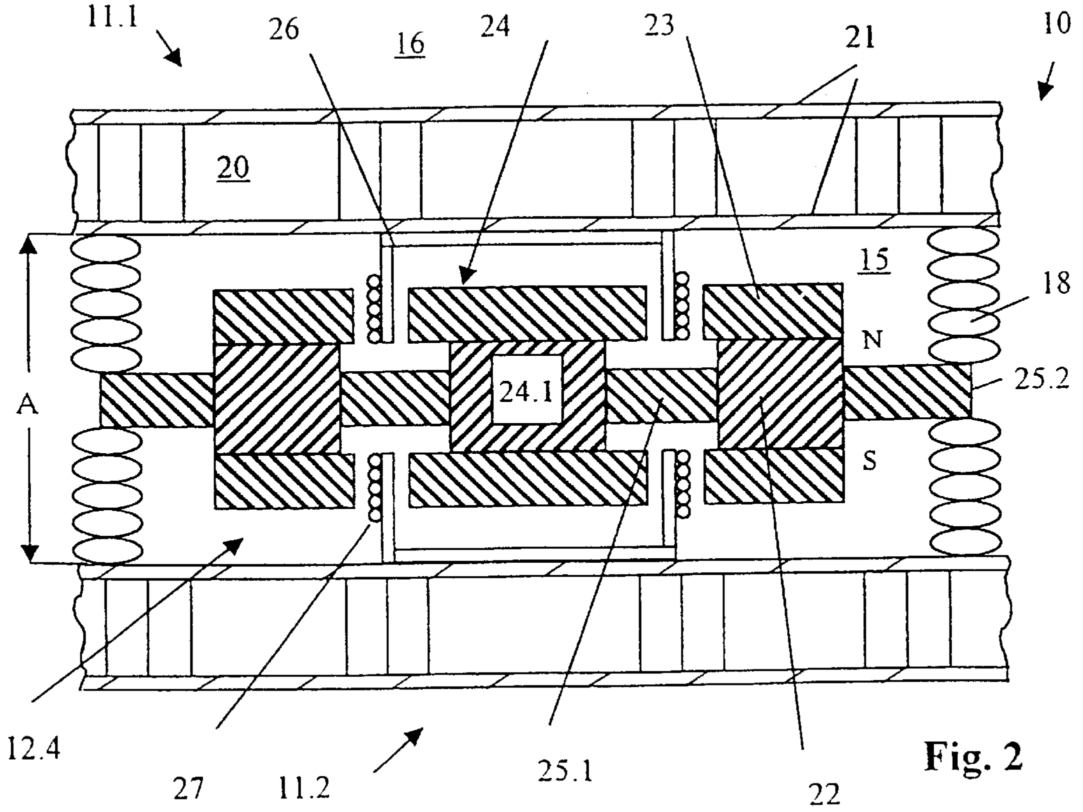
FIG. 2 a cross-section through a driver of a sound reproduction device.

The embodiment of FIG. 2 shows a sound reproduction device 10 in greater detail. As seen in FIG. 2, each of the two sound panels 11.1, 11.2 is formed of a core layer 20 with a honeycomb structure and two cover layers 21. Moreover, in the embodiment depicted in FIG. 2, the drivers 12.1, 12.2 which—according to FIG. 1—drive the two sound panels 11.1, 11.2, are implemented as a common driver 12.4. In this case, an annular permanent magnet 22 is provided with respective pole faces N, S that have a pole disk 23 with an annular shape. In addition, the unit formed of the permanent magnet 22 and the pole disk 23 encircles a pole core 24 with a lateral gap. Since the common driver 12.4 is located halfway across the gap A between the two sound panels 11.1, 11.2, the present embodiment uses two annular support members 25 made of a non-ferromagnetic material. One of the support members 25.1 connects the permanent magnet 22 with the pole core 24, whereas the other support member 25.2 extends from the permanent magnet 22 to the resilient elements 18 that are disposed laterally spaced-apart from the common driver 12.4 and is connected thereto. In another embodiment (not shown), the support member 25.2 can also be connected to other drivers 12 and/or also to the marginal edge 13 (FIG. 1). It should also be noted that the support members 25.1, 25.2 can be made of a spring-like material, that due to their alignment parallel to the sound panels 11.1, 11.2 operate as leaf springs.

In addition, two bell-shaped moving coil supports 26 are provided, with each coil supports 26 connected with a respective one of the two sound panels 11.1, 11.2. Each of the marginal edges of the two moving coil supports 26 has a moving coil 27 and projects into the gap disposed between the pole core 24 and the unit formed of the permanent magnet 22 and the pole disk 23.

If the sound reproduction device 10 depicted in FIG. 2, like the device of FIG. 1, is to be used for bass reproduction and if according to the earlier discussion the two sound panels 11.1, 11.2 move in opposite directions when excited by the audio signals, then the current in the two moving coils 27 has to flow in different directions.

It should also be mentioned that in the embodiment depicted in FIG. 2 a sufficiently large induction can be attained by employing a permanent magnet 22 made of a rare earth alloy, for example, a neodymium alloy. As known by those skilled in the art, the induction can be increased further by modifying the embodiment of FIG. 2, for example, by connecting additional permanent magnets to the common driver 12.4, for example, by fabricating the portion 24.1 of the pole core 24 of a permanent magnetic material.

If, as in the embodiment depicted in FIG. 2, the sound production device 10 does not include a sound exit opening 17 connecting the space 15 with the auditorium 16, then the space 15 should be at least partially filled with a sound-absorbing material (not shown).

It should also be mentioned that the pole core 14 in the embodiment of FIG. 2 need not be connected with the permanent magnet 22 through the support member 25.1, but can alternatively be connected with the sound panels 11.1, 11.2. To prevent damping, the connection between the pole core 24 and sound panels 11.1, 11.2 should be made elastic.

Figure 3:
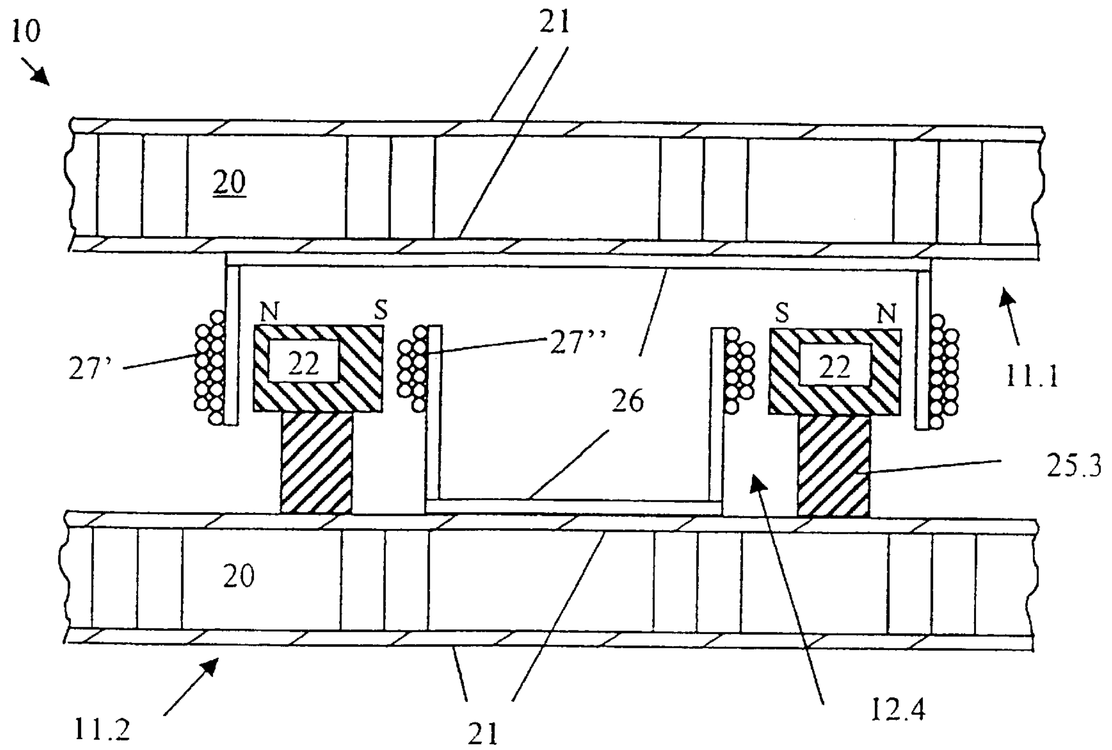
FIG. 3 another diagram of a device according to FIG. 2.

FIG. 3 shows a common driver 12.4 which is modified from the driver 12.4 of FIG. 2. The driver 12.4 depicted in FIG. 3 also includes an annular permanent magnet 22 and two moving coil supports 26 connected with the moving coil 27. Unlike the embodiment of FIG. 2, the embodiment of FIG. 3 completely eliminates so-called flux return elements in the form of pole disks and/or pole cores. Instead, the arrangement of FIG. 3 provides a flux return path solely by way of an air gap between the two poles N, S and the radially magnetized permanent magnet 22. This is accomplished by connecting the permanent magnet 22 with the sound panel 11.2 through a support member 25.3. When the sound reproduction device 10 is in the rest position, the moving coil 27' which is connected with the sound panel 11.2 via the moving coil supports 26, is positioned with a narrow lateral gap near the South pole S of the radially magnetized permanent magnet 22, whereas the other moving coil 27" is positioned next to the other pole N of the permanent magnet 22, also with a narrow lateral gap. Because the two moving coils 27', 27" have different diameters, different conditions can be achieved, whereby the two sound panels 11.1, 11.2 of the sound reproduction device 10 depicted in FIG. 3 can purposely accentuate different frequency ranges. If the two sound panels 11.1, 11.2 of the sound reproduction device 10 of FIG. 3 are to accentuate different frequency ranges, then the cover layers 21 and/or the core layers 20 of the two sound panels 11.1, 11.2 should be optimized for the respective frequency ranges.

Figure 4:
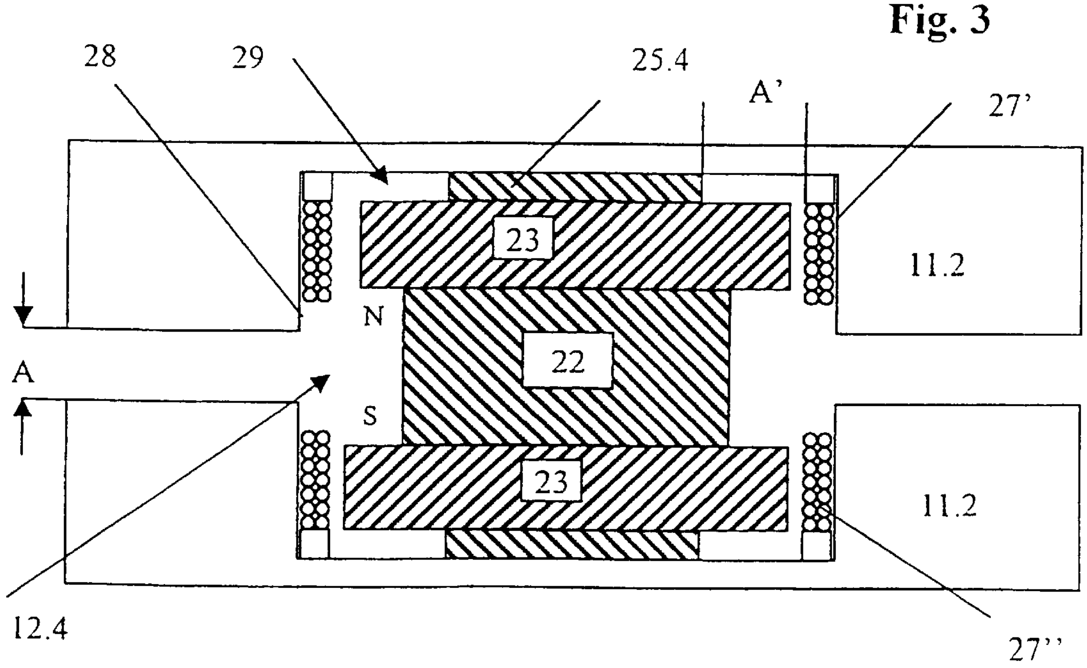
FIG. 4 another diagram of a device according to FIG. 2.

The driver 12.4 of FIG. 4, unlike the driver 12.4 of FIG. 3, includes pole disks 23, although the air gap located between the two poles N, S of the permanent magnet 22 also allows a flux return. In this case, the pole disks that are connected with the pole faces N. S of the axially magnetized permanent magnet 22 do not form a direct flux return, but rather aid in concentrating the field lines emanating from the permanent magnet 22 of the moving coils 27' and 27". In the embodiment of FIG. 4, unlike the previously described embodiments, a separate moving coil support is eliminated. Instead, the moving coils 27', 27" are connected to the marginal edges 28 of milled-out portions 29 formed in each of the two sound panels 11.1, 11.2. The driver 12.4 formed of the permanent magnet 22 and the two pole disks 23 is inserted with a gap A by using the milled-out portions 29. The pole disks 23 and the sound panels 11.1, 11.2 are connected directly through a support member 25.4. According to another embodiment (not shown), the support members 25.4 which may also be provided by a milled-out portion 29 in the respective sound panel 11.1 or 11.2, form a lateral gap A" with the largest possible spacing between the moving coils 27', 27" and the points where the sound panels 11.1, 11.2 are connected with the drivers 12. This arrangement provides a particularly advantageous force transfer to the sound panels 11.1, 11.2.

In the embodiment depicted in FIG. 3, an additional support member (not shown) can be provided between the moving coil support 26 that is connected with the sound panel 11.2, and the sound panel 11.2. The additional support member has a diameter that is smaller than the diameter of the aforedescribed moving coil support 26.

Figure 6:
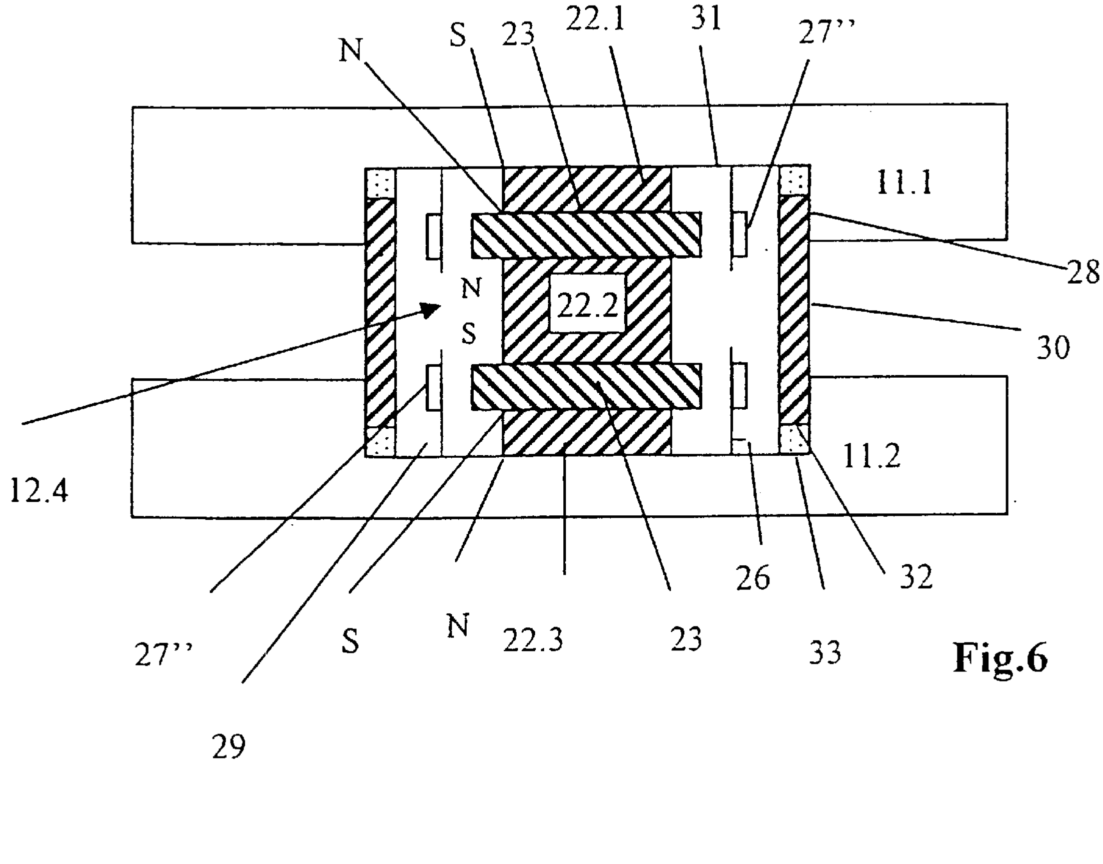
FIG. 6 yet another diagram of a device according to FIG. 2.

As seen in FIG. 6, the magnetic resistance and the driving force can be increased by using a driver 12.4 that is modified from the driver depicted in FIG. 4. The driver 12.4 of FIG. 6 is essentially formed by three axially magnetized permanent magnet disks 22.1 to 22.3, two pole disks and a flux return tube 30. The two pole faces N, S of the permanent magnet 22.2 are connected with the two pole disks 23. In addition, on each side of each pole disk 23 that is not connected with a permanent magnet 22.2, an additional permanent magnet 22.1, 22.3 is attached and connected so that identical poles N or S act on each side of the two pole disks 23 that are connected with the permanent magnets 22.2, 22.1 and 22.3, 22.1, respectively. As seen in FIG. 6, the permanent magnets 22.2 and 22.3 is which are connected directly with the bottoms 31 of the milled-out portions in the sound panels 11.1, 11.2, have a smaller diameter than the pole disks 23. In another embodiment (not shown), the impression of bending waves into the sound panels 11.1, 11.2 can be further enhanced by disposing a support member (25.4) between the respective bottoms 31 and the permanent magnet 22.1, 22.2, as also shown in FIG. 4. The support member 25.4 has a smaller diameter than the permanent magnets 22.1 and 22.3.

The magnetic resistance of the flux return path can be reduced by inserting the assembly consisting of the pole disks 23 and the permanent magnets 22.1 to 22.3 into a flux return tube 30 which surrounds the assembly while leaving a lateral gap. The moving coil supports 26 that include the moving coils 27', 27" and act on the two sound panels 11.1, 11.2 are inserted into this annular gap. The flux return tube 30 is connected with the marginal edges 28 of the milled-out portion 29 located in the sound panels 11.1, 11.2. In addition, a damping element 33 shown as a dotted area is inserted between the bottoms 31 and the end faces 32 of the flux return tube 30. The damping element 33 reduces the damping otherwise produced by the flux return tube 30. It should be mentioned that the flux return tube 30 can not only be used with the drivers depicted in FIG. 6, but can be adapted for use with the device depicted in FIG. 4.

A direct connection of the type depicted in FIG. 6 between, on one hand, the common driver 12.4 and the flux return tube 30 and, on the other hand, the sound panels 11.1, 11.2 can be eliminated by using an alternative attachment, similar to the one described with reference to FIG. 2, through resilient elements 18 and corresponding support members 25.

Figure 5:
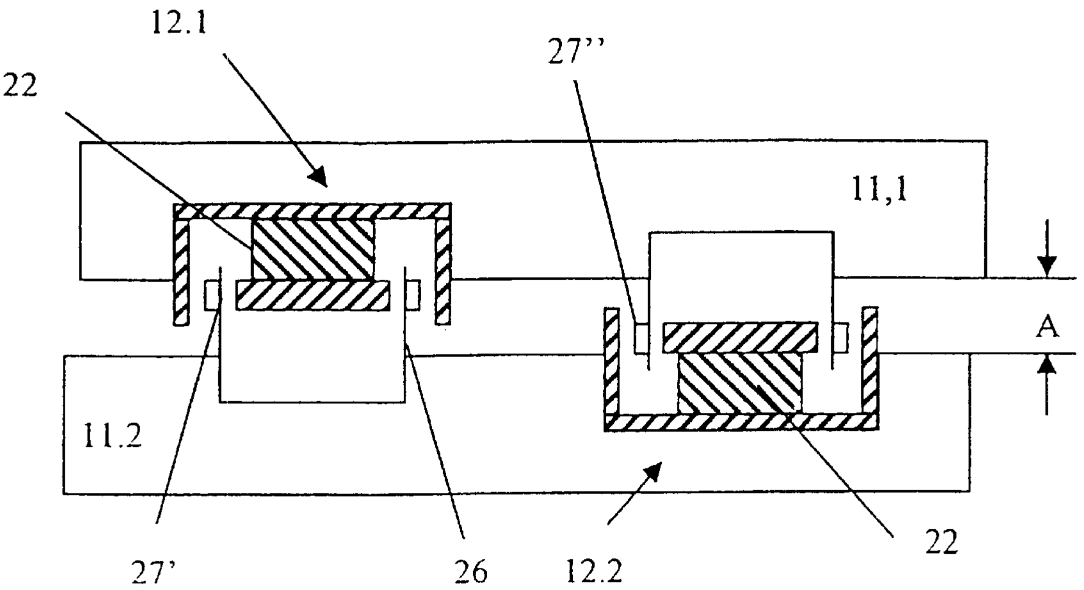
FIG. 5 another diagram of a device according to FIG. 2.

FIG. 5 shows two sound panels 11.1, 11.2 spaced apart by a gap A, with each sound panel having a driver 12.1, 12.2 and a moving coil support 26 with a moving coil 27', 27". The respective drivers 12.1, 12.2 are located relative to the moving coil support 26 and moving coil 27', 27", respectively, so that the moving coil 27" that is connected to the sound panel 11.1 engages with the bell-shaped driver 12.2 that is connected to the sound panel 11.2, whereas the moving coil 27' engages with the driver 12.1 disposed on the sound panel 11.1. The embodiment of FIG. 5 does not include mutual support for the two drivers 12.1, 12.2. This lack of support is compensated by the counter support provided by the inertial masses of the drivers 12.1, 12.2 or, more particularly, the permanent magnets 22 of the respective drivers.

What is claimed is:

1. Sound reproduction device comprising at least two sound panels, each sound panel formed of a core layer and at least two cover layers positioned on opposing sides of the core layer, and each sound panel having at least one driver which is attached to or integrated with the sound panel, wherein two of the sound panels are arranged so as to form a gap therebetween, the sound reproduction device further including a connecting element that connects the two sound panels with one another, wherein the at least one driver of one sound panel is disposed on a side of the respective sound panel so as to face a side of the other sound panel having the at least one driver of the other sound panel.

2. Sound reproduction device according to claim 1, wherein at least one driver of one of the two sound panels is connected with a driver of the other one of the two sound panels.

3. Sound reproduction device according to claim 2, wherein the connected drivers of both sound panels are formed as a common driver.

4. Sound reproduction device according to claim 1, wherein the connecting element is a frame that is connected with edges of the at least two sound panels.

5. Sound reproduction device according to claim 1, further including resilient elements disposed between two sides of the sound panels that face each other.

6. Sound reproduction device according to claim 1, wherein at least one of the sound panels and the connecting elements has at least one sound exit opening.

7. Sound reproduction device according to claim 5, wherein the at least one driver is connected with the connecting elements and the resilient elements.

8. Sound reproduction device according to claim 1, wherein at least one of a cover layer and the core layer of one of the two sound panels is made of a material that is different or has different dimensions from a material of at least one of a cover layer and the core layer of the other of the two sound panels.

9. A sound reproduction device, comprising:

a front sound panel having a core layer and at least two cover layers positioned on opposing sides of the core layer;

a rear sound panel having a core layer and at least two cover layers positioned on opposing sides of the core layer;

a first driver between the front sound panel and the rear sound panel and facing the front sound panel; and a second driver between the front sound panel and the rear sound panel and facing the rear sound panel.

10. The sound reproduction device of claim 9, further comprising a connecting element that connects the front sound panel to the rear sound panel.

11. The sound reproduction device of claim 10, wherein the connecting element comprises a frame that is connected with edges of the front sound panel and the rear sound panel.

12. The sound reproduction device of claim 10, further comprising a sound exit opening disposed in the connecting element.

13. The sound reproduction device of claim 9, further comprising a sound exit opening disposed in at least one of the front sound panel or the rear sound panel.

14. The sound reproduction device of claim 9, wherein the front sound panel and the rear sound panel are spaced apart to form a gap therebetween.

15. The sound reproduction device of claim 9, further comprising resilient elements disposed between a side of the front sound panel and a side of the rear sound panel.

16. The sound reproduction device of claim 9, wherein the first driver is attached to or integrated with the front sound panel, and the second driver is attached to or integrated with the rear sound panel.

17. A sound reproduction device, comprising:

a front sound panel having a core layer and at least two cover layers positioned on opposing sides of the core layer;

a rear sound panel having a core layer and at least two cover layers positioned on opposing sides of the core layer; and a common driver between the front sound panel and the rear sound panel.

18. The sound reproduction device of claim 17, further comprising a connecting element that connects the front sound panel to the rear sound panel, the connecting element forming a gap between the front sound panel and the rear sound panel.

19. The sound reproduction device of claim 18, wherein the connecting element comprises a frame that is connected with edges of the front sound panel and the rear sound panel.

20. The sound reproduction device of claim 18, further comprising a sound exit opening disposed in the connecting element.

21. The sound reproduction device of claim 17, further comprising a sound exit opening disposed in at least one of the front sound panel or the rear sound panel.

22. The sound reproduction device of claim 17, further comprising resilient elements disposed between a side of the front sound panel and a side of the rear sound panel.

23. The sound reproduction device of claim 17, wherein the common driver is attached to or integrated in at least one of the front sound panel and the rear sound panel.

* * * * *